United States Patent [19]

Otobe et al.

[11] Patent Number: 4,618,954
[45] Date of Patent: Oct. 21, 1986

[54] METHOD OF DETECTING ABNORMALITY IN INPUT AND OUTPUT UNITS

[75] Inventors: Yutaka Otobe, Shiki; Takeo Kiuchi, Asaka, both of Japan

[73] Assignee: Honda Giken Kogyo Kabushiki Kaisha, Tokyo, Japan

[21] Appl. No.: 615,056

[22] Filed: May 29, 1984

[30] Foreign Application Priority Data

Jun. 21, 1983 [JP] Japan ................. 58-111665

[51] Int. Cl.⁴ .............................. G06F 11/00
[52] U.S. Cl. ........................ 371/16; 371/15; 371/67
[58] Field of Search ............. 371/13, 16, 19, 20, 371/21, 24, 25, 29, 49, 51, 67, 68; 364/200, 900; 324/73 R, 73 AT

[56] References Cited

U.S. PATENT DOCUMENTS

| 4,360,915 | 11/1982 | Sindelar | 371/51 |
| 4,360,917 | 11/1982 | Sindelar et al. | 371/51 |
| 4,429,391 | 1/1984 | Lee | 371/49 |
| 4,477,901 | 10/1984 | Braband et al. | 371/20 |
| 4,499,581 | 2/1985 | Miazga | 371/20 |
| 4,541,090 | 9/1985 | Shiragasawa | 371/21 |

Primary Examiner—Michael R. Fleming
Attorney, Agent, or Firm—Lyon & Lyon

[57] ABSTRACT

A method of detecting abnormalities through fault diagnosis applied to at least one input unit or output unit by an electronic control unit to which the input unit or output unit is connected. The method comprises the steps of subjecting the input unit or output unit to fault diagnosis, storing information, which is indicative of abnormality, in a first storage area of the electronic control unit when the abnormality is detected as the result of the diagnosis, storing information, which is indicative of the abnormality, in a second storage area of the electronic control unit when the abnormality is detected as the result of subjecting the input or output unit to fault diagnosis again, and rendering a decision to the effect that the input unit or output unit which has undergone the fault detection operation is abnormal when it is determined that the contents stored in the first and second storage areas are identical.

7 Claims, 5 Drawing Figures

METHOD OF DETECTING ABNORMALITY IN INPUT AND OUTPUT UNITS

BACKGROUND OF THE INVENTION

This invention relates to a method of detecting abnormalities in input or output units connected to an electronic control unit.

The input units mentioned in this specification refer to such devices as various sensors for sensing a variety of parameters which indicate the operation of a controlled object and which are to be processed by an electronic control unit to which the sensors are connected. The output units mentioned in this specification refer to actuators controlled by control signals produced as outputs by the electronic control unit on the basis of, e.g., parameter values obtained from the foregoing sensors. By way of example, where the controlled object is an electronic control system for controlling the operation of an internal combustion engine, the input units are, e.g., various sensors for sensing a variety of engine operating parameters such as engine rpm, intake pipe pressure, engine temperature and throttle valve opening. Examples of the output units are a fuel injection valve, a supplementary air quantity control valve for bypassing a throttle valve, an air-fuel ratio control valve, and various other control devices.

Output signals from input devices of the above-described type are processed by the electronic control unit, and the output unit is actuated by a control output from the electronic control unit commensurate with the results of the processing, thereby controlling the operation of the controlled object. Proper control cannot be performed if an input or output unit develops an abnormality of any kind. Accordingly, in order to avoid a situation in which the electronic control unit operates erroneously owing to an abnormality in an input or output unit, a method adopted conventionally is to sense any abnormality in the input and output units and, when an abnormality is sensed, to either issue an alarm or perform an operation to compensate for the failure.

According to this method of detecting an abnormality in an input or output unit, the method in many cases is as disclosed in the specification of Japanese Patent Provisional Publication No. 141926, which includes obtaining a signal indicative of the operating state of the input or output unit, monitoring the level of the signal, rendering a decision that the input or output unit is operating abnormally when the signal exceeds the upper and lower limits of a normal level continuously for a predetermined period of time, and storing, in a memory device comprising a random-access memory or the like, information indicative of an abnormality for determining whether or not a predetermined alarm action or a predetermined failure compensating action is to be carried out when the abnormality is detected.

With this conventional method of abnormality detection wherein an abnormality is determined to have occurred based on only a single discrimination operation and the information indicative of the abnormality is stored in the memory device, there are instances where erroneous information ascribable to but a single accidental occurrence of external noise is written into the memory device even though the input and output units are actually devoid of any malfunction. If such erroneous information is written into the memory, an accurate determination as to whether an input or output unit is operating abnormally cannot be made. As a result of this problem, the electronic control unit may operate erroneously as by not implementing the alarm or failure compensation action when an abnormality actually occurs, or by unnecessarily executing the failure compensation action when no abnormality has actually developed.

SUMMARY OF THE INVENTION

It is therefore the object of the invention to provide a method of detecting an abnormality in an input unit and/or output unit connected to an electronic control unit, which method enables highly reliable detection by greatly reducing the possibility of making an erroneous decision concerning the occurrence of an abnormality and ascribable to failure information rendered erroneous by external noise or the like.

According to a first characterizing feature of the present invention, there is provided a method of detecting abnormalities through fault diagnosis applied to one input unit or one output unit by an electronic control unit to which the input unit or output unit is connected. The method is characterized by the following steps: (a) subjecting the input unit or output unit to fault diagnosis; (b) storing information, which is indicative of abnormality; in a first storage area of a memory in the electronic control unit when the abnormality is detected by the diagnosis, (c) subjecting the input unit or output unit to fault diagnosis again; (d) when the abnormality is detected in the step (c), storing such information in a second storage area of the memory; (e) determining whether contents stored in the first and second storage areas are identical; and (f) rendering a decision to the effect that an abnormality has occurred in the input unit or output unit when the contents stored in the first and second storage areas are determined to be identical.

According to a second characterizing feature of the present invention, there is provided a method of detecting abnormalities through fault diagnosis applied to a plurality of devices by an electronic control unit to which the devices are connected, each device comprising an input unit or an output unit. The method is characterized by the following steps: (a) presetting a plurality of codes corresponding to respective ones of said plurality of devices; (b) subjecting the plurality of devices to fault diagnosis, (c) when an abnormality is detected in step (b), storing one of the codes corresponding to one of the devices in which the abnormality has been detected, in the first storage area of a memory provided in the electronic control unit; (d) subjecting the above one device in which the abnormality has been detected to fault diagnosis again; (e) when an abnormality is detected in step (d), storing the above one code corresponding to the above one device in which the abnormality has been detected in the second storage area of the memory; (f) determining whether contents stored in the first and second storage areas are identical; and (g) rendering a decision to the effect that an abnormality has occurred in the above one device corresponding to the above one code stored in both of the first and second storage areas when the contents stored in the first and second storage areas are determined to be identical.

The above and other objects, features and advantages of the invention will be more apparent from the ensuing detailed description taken in connection with the accompanying drawings.

BRIEF DESCRIPTION OF THE DRAWINGS

FIG. 3 illustrates how FIGS. 3A and 3B are connected together; and FIGS. 3A and 3B are flowcharts illustrating details of the subroutines executing the fault detection as well as the alarm and failure compensation operations according to the abnormality detection method of the present invention.

DETAILED DESCRIPTION

A preferred embodiment of the present invention will now be described in detail with reference to the drawings.

Figure 1:
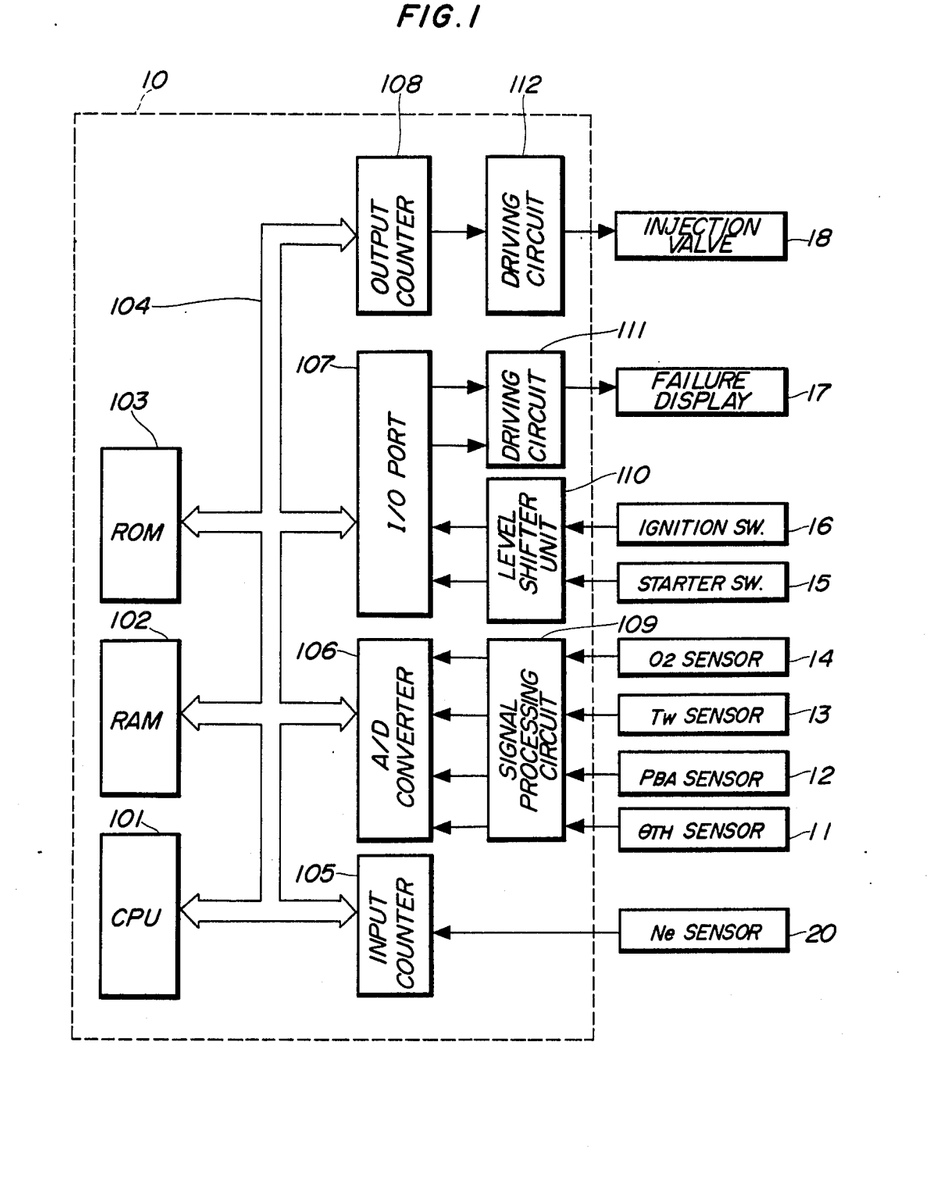
FIG. 1 is a block diagram exemplifying an electronic control unit to which the method of the present invention is applied.

FIG. 1 illustrates an example of the construction of an electronic control unit (hereinafter called "the ECU") to which the method of the present invention is applied. The ECU 10 acts to supply an automotive internal combustion engine, not shown, with required quantities of fuel commensurate with operating conditions of the engine so as to optimize the operating characteristics of the engine, and is adapted to perform an alarm or failure compensation operation upon sensing that an abnormality has developed in the operation of any of various sensors and injection valves, which are described below, that serve as input and output units. More specifically, the ECU 10 comprises a central processing unit (hereinafter called "the CPU") 101 that includes a predetermined number of program timers for abnormality detection, a random-access memory (hereinafter called "the RAM") 102 for temporarily storing various data, and a read-only memory (hereinafter called "the ROM") 103 storing a control program for calculation of fuel supply quantity, various maps and tables, and control programs for input/output unit fault detection and for implementing alarm and failure compensation operations. The CPU 101, RAM 102 and ROM 103 are interconnected by a bus 104, and are connected by the bus to an input counter 105, an A-D converter 106, an input/output port 107 and an output counter 108.

The input counter 105 is supplied with a signal indicative of engine rpm Ne obtained from an engine rpm sensor 20. The A-D converter 106 sequentially receives, through a signal processing circuit 109, output signals from a sensor 11 for sensing the throttle valve opening θth, a sensor 12 for sensing intake manifold absolute pressure PBA, a sensor 13 for sensing engine coolant temperature TW, and an O₂ sensor 14 for sensing the concentration of an exhaust gas ingredient. Applied to the input/output port 107 of the ECU 10 through a level shifter unit 110 are signals from an engine starter switch 15 and an ignition switch 16, the signals indicating whether the respective switches are on (closed) or off (open). Connected to the input/output port 107 through a driving circuit 111 is a light emitting diode (LED) 17 which indicates the status of a failure of the input and output units.

The CPU 101, in synchronism with the generation of a predetermined control signal, e.g., an rpm signal pulse from the engine rpm (Ne) sensor 20, calculates an amount of injected fuel to be supplied to the engine on the basis of signals from the various sensors mentioned above, and sequentially provides the output counter 108 with an output value corresponding to the calculated fuel injection quantity. The output counter 108 performs a counting operation for a period of time commensurate with the aforementioned output value, and simultaneously applies its output to a driving circuit 112. The latter opens the injection valves 18 for as long as it receives the output of the counter 108, whereby the engine is supplied with a required amount of fuel commensurate with its operating condition.

As will be described in detail below, the ECU 10 executes a predetermined fault detection subroutine in synchronism with generation of the engine rpm signal. Alternatively, the detection subroutine may be executed in synchronism with generation of an interrupt signal generated at constant time intervals. Specifically, in accordance with the subroutine, the ECU 10 is adapted to determine whether an abnormality has occurred in the operation of the foregoing input and output units, namely some or all of the sensors, switches and injection valve 11-16, 18, 20, based on signals, e.g., the output signals thereof, indicative of operating conditions of these units. Upon determining that any of the input or output units is operating abnormally, the ECU 10, in accordance with the foregoing cycle, writes a failure code serving as predetermined failure information in the RAM 102 at a first predetermined address area thereof, this being performed for an input unit or output unit initially determined to be defective. Following this first determination, the ECU 10 again determines whether an abnormality exists in the input or output unit initially found to be defective. If the result of this second determination is that the particular unit is still defective, then the ECU 10 writes the corresponding failure information into the RAM 102 at a second predetermined address area thereof.

Figure 2:
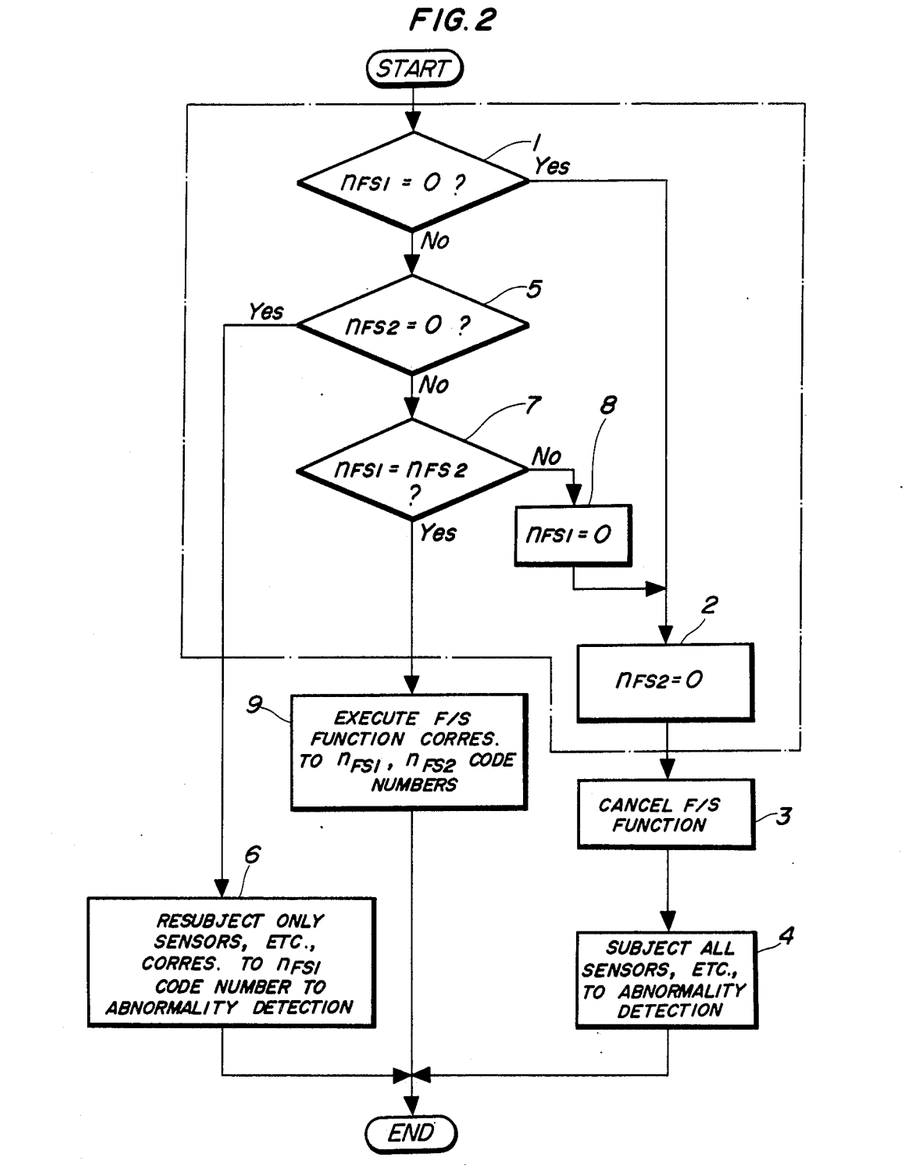
FIG. 2 is a flowchart illustrating the general features of subroutines for executing fault detection as well as alarm and failure compensation operations according to the abnormality detection method of the present invention.

FIG. 2 illustrates the general features of a program embodying the abnormality detection method according to the present invention. The present program is called by pulses of the engine rpm signal. In FIG. 2, reference characters $n_{FS1}$, $n_{FS2}$ denote flags for failure determination or coded stored information written into the RAM 102 (FIG. 1) at the first and second predetermined address areas thereof.

First, in the decision step 1 of the flowchart, the CPU 101 determines whether the first stored information $n_{FS1}$ a value of "0". If the decision rendered is affirmative (YES), namely that all units undergoing fault detection (e.g., the sensors, switches and valve 11-16, 18, 20 in FIG. 1) are in a normal operating state, the program moves to step 2 where the second stored information $n_{FS2}$ is cleared to "0", which indicates that all units subjected to fault detection are normal. Thus, when it is determined that the first stored information $n_{FS1}$ has a value of "0", the second stored information $n_{FS2}$ is always set to "0" and all warning and failure compensation actions are cancelled, whereby erroneous fault detection is prevented before it occurs.

Next, the CPU 101 determines whether or not the output signal level from each unit undergoing fault detection is normal to decide whether each unit has developed an abnormality, at the step 4. If all units are found to be free of failure based on these output signal levels, then the CPU 101 produces no failure code write command whatsoever. On the other hand, if any unit does behave abnormally, then the CPU 101 does issue a command in response to which a failure code, which corresponds to the unit (input or output unit) initially detected to have malfunctioned, is written into the RAM 102 at the first predetermined address, followed by terminating execution of the present program.

If the decision rendered in step 1 is negative (NO), the program proceeds to the step 5, where it is determined whether the second stored information $n_{FS2}$ shows a value of "0". If the answer to the step 5 is affirmative (YES), namely, if an abnormality has been found to occur in a unit undergoing fault detection based on the first stored information $n_{FS1}$ but has not yet been found to occur a second time in accordance with the second stored information $n_{FS2}$, then, as will be described in detail later with reference to FIGS. 3A and 3B, whether or not an abnormality has occurred is determined a second time, at the step 6, only with regard to the unit corresponding to the first stored information $n_{FS1}$, namely the unit determined preliminarily to have failed. More specifically, only the unit corresponding to the failure code stored in the first storage area of the RAM 102 is monitored over a predetermined period of time, as will be described below in conjunction with FIGS. 3A and 3B. During this period of time, execution of a program for monitoring the other units that undergo fault detection is suspended by, e.g., a jump instruction in the CPU 101, after which execution of the present program ends.

If a negative (NO) reply is the result of executing the decision step 5, the program moves to step 7, which calls for a decision as to whether or not the two items of stored information $n_{FS1}$, $n_{FS2}$ agree. As described above, the arrangement is such that after the first stored information $n_{FS1}$ has been found not be "0" in the step 1, monitoring takes place in accordance with the step 6 solely with respect to the unit corresponding to the failure code, this step being executed following execution of the step 5. Therefore, non-agreement between the two items of information $n_{FS1}$, $n_{FS2}$ ordinarily does not occur. The reason is that the program can follow only one of two alternatives. Specifically, either the abnormal condition vanishes during the aforesaid monitoring operation and, as will be set forth later in conjunction with FIG. 3, the first stored information $n_{FS1}$ is cleared to result in a YES decision in the step 1, after which the program ends via steps 1 through 4, or the abnormal condition is found to have occurred again and, hence, to have been actualized, in response to which a failure code identical with that of the first stored information $n_{FS1}$ is written into the second predetermined address of the RAM, after which the program is ended through steps 1, 5, 7 and 9, as will be described below.

Accordingly, if the answer to the step 7 is negative, namely, if the first and second items of stored information $n_{FS1}$, $n_{FS2}$ do not agree, this indicates that the non-agreement is the result of external noise. The program then moves to step 8, where the first stored information $n_{FS1}$ is cleared to "0", and execution of the program is ended via steps 2 through 4. Thus, when erroneous information resulting from external noise is written into the RAM 102, the information is cleared immediately by steps 7, 8 to prevent erroneous fault detection.

Next, assume that the answer to the step 7 is affirmative or, in other words, that the same input or output unit undergoing fault detection is found to be abnormal twice within a predetermined period of time, i.e., that the unit is in an abnormal condition continuously over said period, as a result of which agreement is found to exist between items of failure information $n_{FS1}$, $n_{FS2}$ written into the first and second predetermined address areas of the RAM 102. When this is the case, the program moves to step 9, in which a fail safe function, e.g., a predetermined alarm operation and/or a predetermined failure compensation operation are executed, based on a command from the CPU 101, to deal with the input or output unit corresponding to these two items of stored information. The step 9 is followed by the end of execution of the program.

Figures 3, 3A:
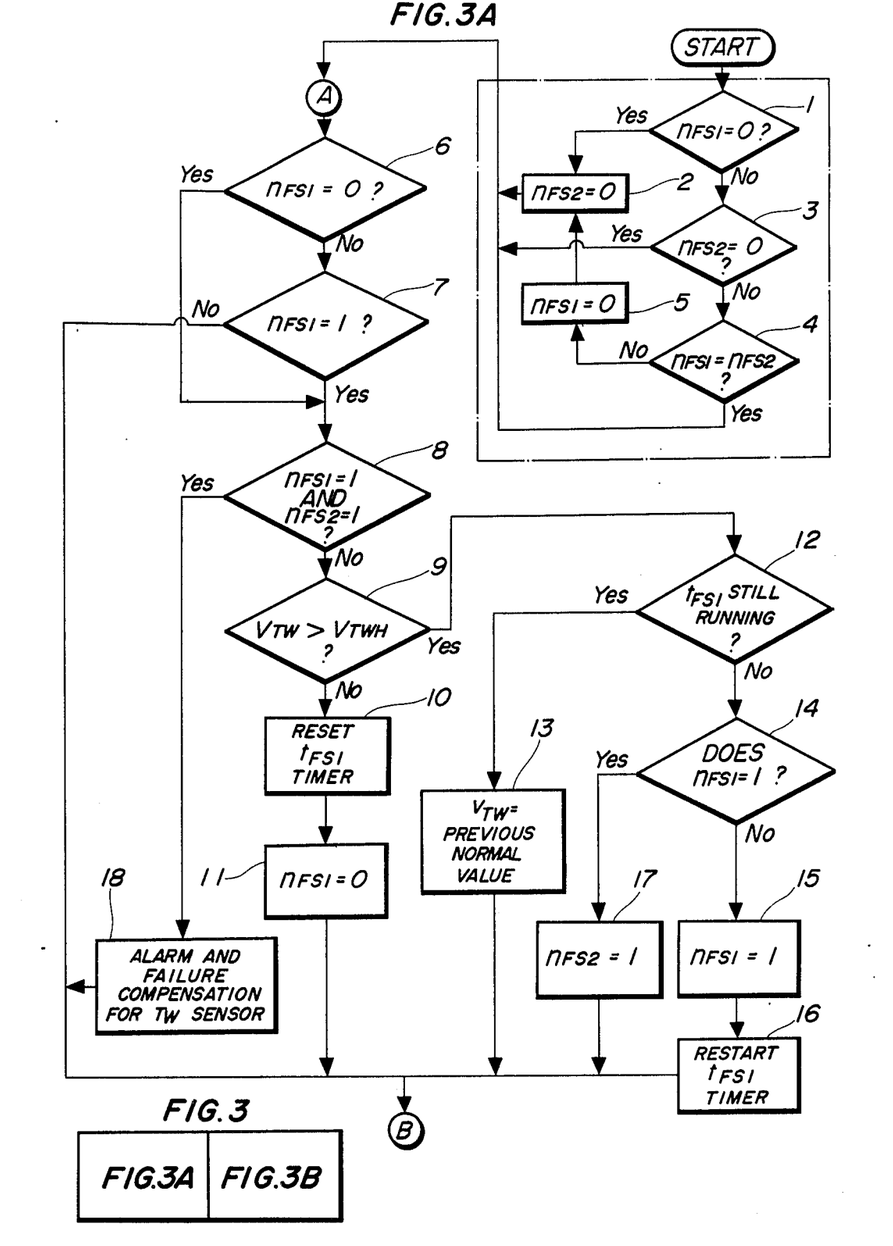
Figure 3B:
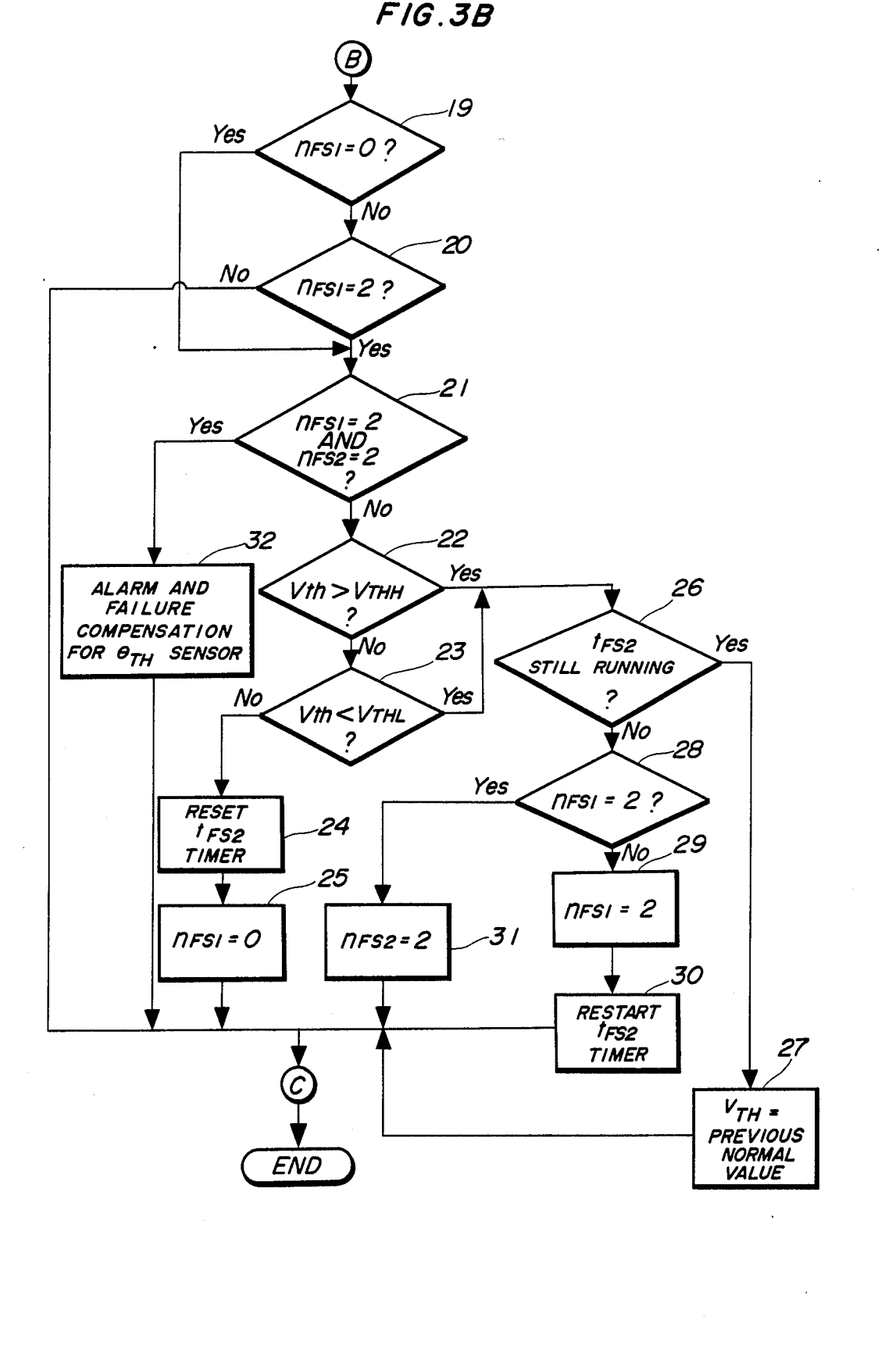

FIG. 3 illustrates details of the foregoing embodiment of the abnormality detection method according to the present invention. In the illustration, it is assumed that the units undergoing fault detection are the sensor 11 for sensing the throttle valve opening and the sensor 12 for engine coolant temperature, which are shown in FIG. 1. In FIG. 3, steps 1 through 5 (the portion enclosed by the chain line) correspond to steps 1, 2, 5, 7 and 8 (the portion enclosed by the chain line) in FIG. 2 and need not be described again.

When the items of stored information $n_{FS1}$, $n_{FS2}$ are found to agree or either one is found to be "0" through steps 1, 3 and 4, the program shifts to a subroutine A-B in which step 6 calls for a decision as to whether the first stored information $n_{FS1}$ has a value of "0". If the result is negative (NO), then it is determined in step 7 whether or not the stored information $n_{FS1}$ has a value of "1" (in decimal notation). The value of "1" here is a failure code indicative of the fact that the coolant temperature sensor 12 is operating abnormally. If the answer to the step 7 is NO, namely, if a unit (the throttle valve opening sensor 11 in the illustrated embodiment) other than the coolant temperature sensor 12 is in an abnormal condition, a decision regarding the operating state of the coolant temperature sensor 12 is reserved and the program moves to a subroutine B-C. Thus, steps 6 and 7 perform the function of the step 6 in the flowchart of FIG. 2.

If a YES decision is rendered in either of steps 6, 7, the program moves to step 8, where it is determined whether the items of stored information $n_{FS1}$, $n_{FS2}$ are both equal to a value of "1". If the answer is NO, then it is determined whether an output voltage value $V_{Tw}$ produced by the coolant temperature sensor 12 is greater than a predetermined upper limit value $V_{TWH}$ (step 9). If it is not (NO), the coolant temperature sensor 12 is taken to be operating normally and a program timer within the CPU 101 is reset in step 10, the timer performing a counting operation over a predetermined period of time $t_{FS1}$ for subjecting the coolant temperature sensor 12 to an abnormality detection. This is followed by clearing the first stored information $n_{FS1}$ in step 11, after which the program moves to the subroutine B-C for subjecting the other sensor 11 to a fault detection operation.

If a YES decision is rendered in the step 9, step 12 is executed, in which it is determined whether or not the operation of the timer is continuing, namely whether the first predetermined time period set in the timer $t_{FS1}$ has not yet elapsed after the occurrence of the abnormal voltage output. If the decision in the step 12 is YES, a final decision regarding the absence or presence of an abnormality in the sensor 12 is reserved and, in order to avoid execution of an erroneous control operation by the CPU 101, the control is performed using a normal output voltage of the sensor 12, which was sensed immediately before the transition to the abnormal value, in place of the actual output voltage $V_{TW}$ which is greater than the upper limit value $V_{TWH}$, at step 13, which is followed by entering the subroutine B-C.

If a NO decision is rendered in step 12, it is determined in step 14 whether the value of the first stored information $n_{FS1}$ is "1". If the answer is negative, the value "1" is written into the RAM 102 at the first predetermined address. More specifically, when the output voltage value $V_{TW}$ of the coolant temperature sensor 12 exceeds the upper limit value $V_{TWH}$ over the predetermined period of time $t_{FS1}$, this is taken as a first detection of an abnormality in the coolant temperature sensor 12, and the first stored information $n_{FS1}$ is set to a failure code of value "1" corresponding to the coolant temperature sensor 12. Next, the program timer fo the coolant temperature sensor is restarted in step 16, followed by entry into the subroutine B-C.

When the first stored information $n_{FS1}$ is thus set to the value "1", negative (NO) decisions are rendered in steps 19 and 20 of the subroutine B-C, execution of the program is ended without making any further decision regarding the operating condition of the throttle valve opening sensor 11, and the program is executed again in synchronism with the generation of the next engine rpm signal pulse.

If the period of time $t_{FS1}$ expires following the first detection of a fault without the output voltage value $V_{TW}$ of the sensor 12 returning to the normal value, NO and YES decisions are rendered in the steps 12 and 14, respectively, and the value "1" is written into the second predetermined address area of the RAM 102 (step 17), thereby completing the second detection of an abnormality with respect to the coolant temperature sensor 12. As a result, when the step 8 is reached via steps 1, 3, 4, 6 and 7 in the next loop of the present program executed in synchronism with generation of the next engine rpm signal pulse, the decision rendered in the step 8 is YES so that alarm and failure compensation operations are executed with regard to the coolant temperature sensor 12 (step 18).

More specifically, when an abnormal condition in the coolant temperature sensor 12 is detected a first time preliminarily and then a second time for confirmatory purposes, a final and conclusive decision is rendered by the CPU 101 to the effect that the coolant temperature sensor 12 is operating abnormally, the CPU 101 issues a command which is applied to the driving circuit 111 in FIG. 1 to energize the light emission diode 17 to indicate that the coolant temperature sensor 12 has developed an abnormality. At the same time, the ECU 10 performs the above-described fuel supply control operation based on artificial temperature data read out of the ROM 103. As an example, used as the artificial temperature is a value which, if the engine is in the process of being started, is set so as to sequentially decrease stepwise with the passage of time from the moment the starter switch 15 is turned on and then become constant upon passage of a predetermined period of time. If the engine has already been started, on the other hand, a value corresponding to a predetermined coolant temperature is used. In this way, an erroneous control operation is prevented from being performed by the CPU 101.

If the output voltage $V_{TW}$ of the coolant sensor 12 returns to a normal value by the time the second fault detection operation is finished following the first detection, a negative decision is rendered in the step 9, the program timer for the coolant temperature sensor is reset in the step 10, and the first stored information $n_{FS1}$ is cleared in the step 11. As a result, the CPU 101 decides that the coolant temperature sensor 12 did not actually malfunction, thereby avoiding an erroneous determination concerning fault detection attributable to accidental causes, such as writing of false information owing to external noise.

The subroutine B-C is for the purpose of detecting an abnormality in the sensor 11 for the throttle valve opening. In the first step 19, it is determined whether or not the first stored information $n_{FS1}$ for indicating failure has a value of "0". If the answer is NO, step 20 is executed to determine whether the first stored information $n_{FS1}$ has a value of "2" (in decimal notation). The value "2" is a failure code which indicates that the operation of the throttle valve opening sensor is abnormal. If the answer to the step 20 is NO, namely, if the engine coolant temperature sensor 12, which is the other unit undergoing fault detection besides the sensor 11, is operating abnormally, abnormality decisions regarding the sensor 11 are suspended, and execution of the program is ended. As a result, in the present case solely the subroutine A-B is executed. The steps 19, 20 therefore correspond to the step 6 in FIG. 2.

If a YES decision is rendered in either of steps 19, 20, the program proceeds to step 21, where it is determined whether or not the first and second items of stored information $n_{FS1}$, $n_{FS2}$ are both equal to a value of "2". If the answer is NO, then it is determined whether an output voltage value $V_{th}$ produced by the throttle valve opening sensor 11 is greater than a predetermined upper limit value $V_{THH}$ (step 22). If the answer to the step 22 is NO, then it is determined in step 23 whether or not the output voltage value $V_{th}$ is smaller than a predetermined limit value $V_{THL}$. If the answer is NO, the throttle sensor 12 is taken to be operating normally and a throttle sensor program timer within the CPU 101 is reset in step 24. Then, in step 25, a value "0" is written into the first predetermined address area of the RAM 102, and execution of the program ends.

If either of the answers to the steps 22 and 23 is affirmative (YES), that is, if the output voltage value $V_{th}$ of the throttle value opening sensor 11 is outside its normal limits, the program proceeds to step 26 to determine whether or not the counting operation of the program timer is continuing, i.e., whether or not a predetermined period of time $t_{FS2}$ has elapsed after the occurrence of the abnormal output voltage. If the answer to the step 26 is YES, confirmatory determination is suspended with respect to occurrence of an abnormality in the sensor 11, and the aforedescribed fuel supply control is performed using as the output voltage value $V_{th}$ a normal voltage value sensed immediately before the occurrence of the abnormal voltage value, at the step 27. Thus, an erroneous control operation is avoided. The step 27 is followed by termination execution of the program.

If a NO decision is rendered in the step 26, the program proceeds to step 28 where it is determined whether or not the value of the first stored information $n_{FS1}$ is "2". If the answer is negative, the value "2" is written into the RAM 102 at the first predetermined address (step 29). More specifically, if the output voltage value $V_{th}$ of the throttle valve opening sensor 11 falls outside the normal limits over the predetermined period of time $t_{FS2}$, the predetermined value "2" is written into the first predetermined address area of the RAM 102 as a failure code for the throttle valve opening sensor 11, thereby completing the first error detection operation relating to the sensor 11.

Next, the program timer for detection of an abnormality in the throttle sensor 11 is restarted in step 30, followed by ending execution of the program. Then, when the program is run again in synchronism with the generation of the next engine rpm signal pulse, the steps 6 and 7 of routine A-B are reached via steps 1 and 3. Since the answers to the steps 6 and 7 will both be negative, a fault determination concerning the engine coolant sensor 12 is omitted, immediately followed by execution of the subroutine B-C.

If, following the first detection of a fault, the output voltage $V_{th}$ of the throttle valve opening sensor 11 returns to a value within the normal limits before the expiration of the second predetermined period time $t_{FS2}$, then a decision is rendered through steps 22 through 25 to the effect that there is no abnormality in the operation of the sensor 11, whereby an erroneous determination ascribable to accidental causes is prevented. On the other hand, if the time period $t_{FS2}$ expires without the output voltage value $V_{th}$ returning to a normal value, affirmative decisions are rendered in the steps 26, 28 of the program executed immediately thereafter. Therefore, the value "2" is written into the second predetermined address area of the RAM 102 (step 31), thereby completing the second detection of an abnormality with respect to the throttle valve opening sensor 11. As a result, a YES decision is rendered in the step 21 of the main program executed in the next abnormality detection cycle. In other words, a definite decision is rendered in step 21 to the effect that the throttle valve opening sensor 11 is defective. Then, as in the step 18, the light emission diode 17 (FIG. 1) indicates the fact that the throttle valve opening sensor 11 has malfunctioned, and the fuel supply is controlled by the ECU 10 on the basis of artificial data indicative of throttle valve opening read out of the ROM 103, e.g., a signal indicative of a predetermined throttle valve opening (step 32). This prevents the ECU 10 from performing an erroneous control operation, and is followed by ending the execution of the program.

The abnormality detection method of the present invention described above exhibits the following advantages:

(1) When an abnormality is determined preliminarily to have occurred in at least one input unit and/or output unit, information corresponding to the same unit is stored in a first predetermined address area of a memory device. Thereafter, following the expiration of a predetermined period of time, the same unit is subjected to the abnormality detection operation again. When it is determined for the second time that the unit is still functioning abnormally, information corresponding thereto is stored in a second predetermined address area of the memory device. Then, only when it is determined that both items of information agree is a definite decision rendered to the effect that the unit corresponding to this information is abnormal. This makes it possible to detect, in accurate and reliable fashion, and without the influence of external noise or the like, whether or not an abnormality has developed in an input and/or output unit.

(2) In situations where a plurality of input units and/or output units are subjected to fault detection, a plurality of predetermined failure codes, which correspond to respective ones of the input and/or output units, are used as failure information. Accordingly, each of the units can be subjected to detection for abnormalities in accurate fashion, and a large-capacity memory device is unnecessary.

What is claimed is:

1. A method of detecting abnormalities through fault diagnosis applied to one input unit or one output unit by an electronic control unit to which said input unit or output unit is connected, said method comprising the steps of:
   (a) subjecting said input unit or output unit to fault diagnosis wherein it is determined whether or not a signal indicative of operating conditions of said one input or output unit indicates a value which can be assumed when said one unit is in normal operating conditions;
   (b) storing information, which is indicative of abnormality, in a first storage area of a memory in a first storage area of a memory in said electronic control unit when the abnormality detected by the diagnosis continues over a predetermined period of time ($t_{FS1}$, $t_{FS2}$);
   (c) subjecting said one input unit or output unit in which said abnormality has been detected, to the step (a);
   (d) storing information, which is indicative of abnormality, in a second storage area of a memory in said electronic control unit when the abnormality detected by the diagnosis continues over said predetermined period of time ($t_{FS1}$, $t_{FS2}$);
   (e) determining whether or not contents stored in said first and second storage areas are identical;
   (f) rendering a decision to the effect that an abnormality has occurred in said one input unit or output unit when the contents stored in said first and second storage areas are determined to be identical; and
   (g) the contents stored in said first and second storage areas are cleared when it is determined in said step (e) that the contents are not identical, thereby ensuring the detection of the occurrence of an abnormality in said one input or output unit, without being influenced by external noise or the like.

2. A method as claimed in claim 1, wherein the fault diagnosis of said step (c) is performed upon passage of a predetermined period of time following execution of the fault diagnosis of said step (a).

3. A method as claimed in claim 1, wherein a control signal having a substitutive value is generated instead of said one input or output unit in which said abnormality has been detected, after the occurrence of said abnormality was definitely detected.

4. A method of detecting abnormality through fault diagnosis applied to a plurality of devices by an electronic control unit which includes a memory having first and second storage areas, each of said devices comprising an input unit or an output unit connected to said electronic control unit, said method comprising the steps of:
   (a) presetting a plurality of codes corresponding to respective ones of said plurality of devices;
   (b) subjecting said plurality of devices to fault diagnosis wherein it is determined whether or not a signal indicative of operating conditions of said one device indicates a value which can be assumed when said one device is in normal operating conditions;
   (c) when an abnormality detected in said step (b) continues over a predetermined period of time ($t_{FS1}$, $t_{FS2}$), storing one of said codes corresponding to one of said devices in which said abnormality has been detected, in said first storage area of said memory;

(d) subjecting said one device in which said abnormality has been detected, to the step (b);

(e) when an abnormality detected in said step (b) continues over a predetermined period of time ($t_{FS1}$, $t_{FS2}$), storing one of said codes corresponding to one of said devices in which said abnormality has been detected, in said second storage area of said memory;

(f) determining whether contents stored in said first and second storage areas are identical;

(g) rendering a decision to the effect that an abnormality has occured in said one device corresponding to said one code stored in both of said first and second storage areas when the contents stored in said first and second storage areas are determined to be identical; and (h) the contents of said first and second storage areas are cleared when it is determined in said step (f) that the contents of said first and second storage areas are not identical, thereby ensuring the detection of the occurrence of an abnormality in said one device, without being influenced by external noise or the like.

5. A method as claimed in claim 4, wherein the fault diagnosis of said step (d) is performed upon passage of a predetermined period of time following execution of the fault diagnosis of said step (b).

6. A method as claimed in claim 4, wherein said step (d) of performing fault diagnosis again is executed solely with respect to one of said devices in which an abnormality has been detected in said step (b).

7. A method as claimed in claim 4, wherein a control signal having a substitutive value is generated instead of said one device in which said abnormality has been detected, after the occurrence of said abnormality was definitely detected.

* * * * *